(12) United States Patent
Kikuchi

(10) Patent No.: US 10,560,623 B2
(45) Date of Patent: Feb. 11, 2020

(54) IMAGING ELEMENT AND IMAGING DEVICE

(71) Applicant: Olympus Corporation, Hachioji-shi, Tokyo (JP)

(72) Inventor: Tetsuo Kikuchi, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 16/215,574

(22) Filed: Dec. 10, 2018

(65) Prior Publication Data

US 2019/0182431 A1 Jun. 13, 2019

(30) Foreign Application Priority Data

Dec. 13, 2017 (JP) ................................. 2017-238348

(51) Int. Cl.
*H04N 5/232* (2006.01)
*H04N 5/341* (2011.01)
*H01L 27/146* (2006.01)

(52) U.S. Cl.
CPC ....... *H04N 5/232122* (2018.08); *H04N 5/341* (2013.01); *H01L 27/14621* (2013.01); *H01L 27/14627* (2013.01)

(58) Field of Classification Search
CPC ............. H04N 5/232122; H04N 5/341; H04N 5/36961; H04N 9/04557; H04N 5/3456; H01L 27/14627; H01L 27/14621
See application file for complete search history.

(56) References Cited

U.S. PATENT DOCUMENTS

| | | | | |
|---|---|---|---|---|
| 2011/0025904 | A1* | 2/2011 | Onuki | G02B 7/34 348/360 |
| 2011/0037888 | A1* | 2/2011 | Onuki | G02B 7/346 348/340 |
| 2012/0268613 | A1* | 10/2012 | Nishio | G02B 7/346 348/208.5 |
| 2013/0120644 | A1* | 5/2013 | Fujii | G02B 7/36 348/349 |
| 2015/0304547 | A1* | 10/2015 | Inoue | G02B 7/34 348/349 |
| 2016/0018721 | A1* | 1/2016 | Okazawa | G02B 7/34 348/345 |
| 2017/0064190 | A1* | 3/2017 | Tamaki | H04N 5/23212 |
| 2017/0353678 | A1* | 12/2017 | Ogushi | H04N 5/23212 |
| 2017/0366769 | A1* | 12/2017 | Mlinar | H04N 5/35563 |
| 2018/0176452 | A1* | 6/2018 | Nikkanen | H04N 5/23212 |

FOREIGN PATENT DOCUMENTS

JP 2015-046761 3/2015

* cited by examiner

*Primary Examiner* — Nhan T Tran
(74) *Attorney, Agent, or Firm* — John C. Pokotylo; Pokotylo Patent Services

(57) ABSTRACT

An imaging element includes microlenses, first pixel portions, and second pixel portions. The microlenses are arranged in first and second directions. The first and second pixel portions correspond to the microlenses. The first pixel portions include light receiving portions, which are pupil-split in the first direction. The second pixel portions include light receiving portions, which are pupil-split in the first direction. The light receiving portions include a light receiving region and a non-light receiving region along the second direction. The first pixel portions are arranged in the first direction and the second direction. The second pixel portions are substituted for some of the first pixel portions and are adjacently or discretely arranged in the second direction.

16 Claims, 13 Drawing Sheets

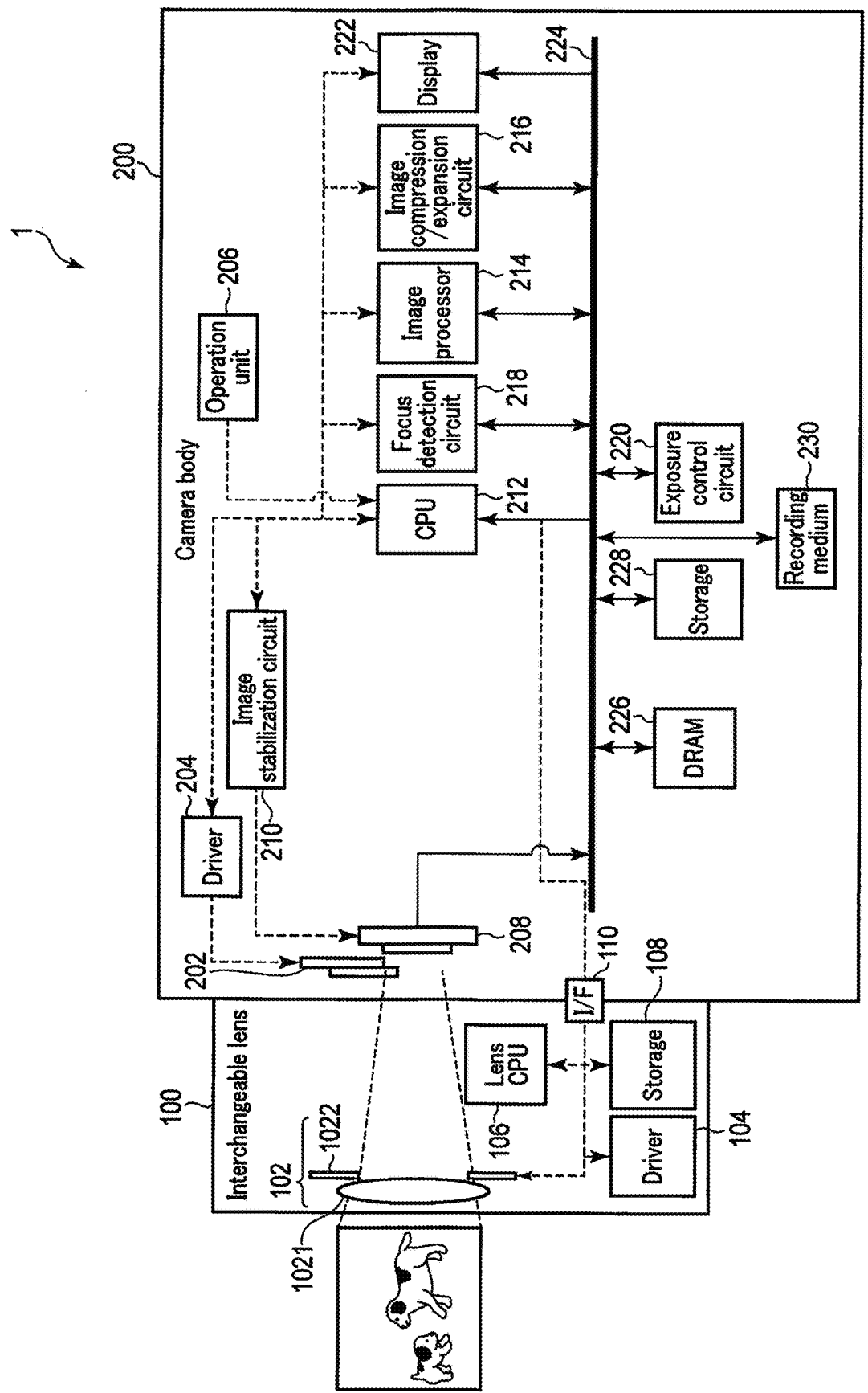
F I G. 1

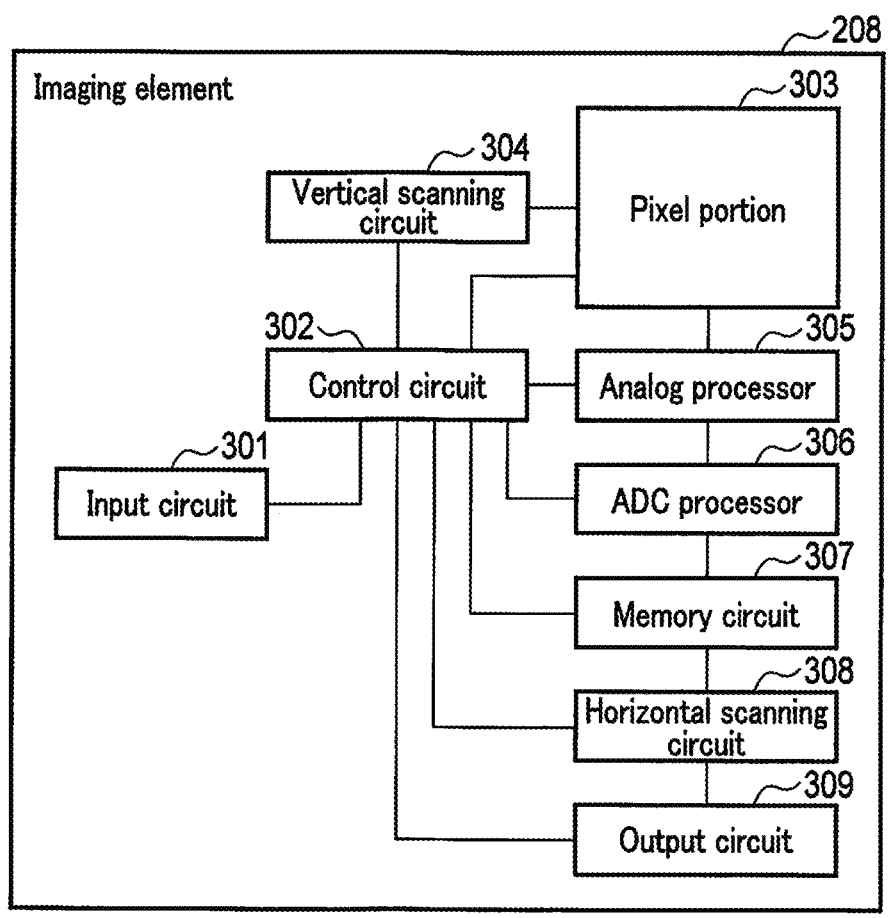
F I G. 2

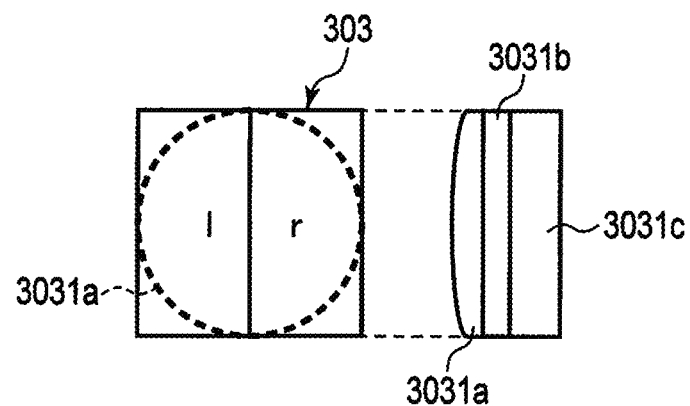
F I G. 3
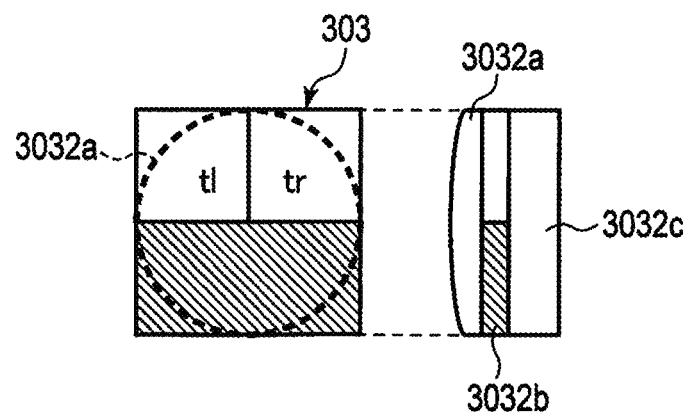
F I G. 4A
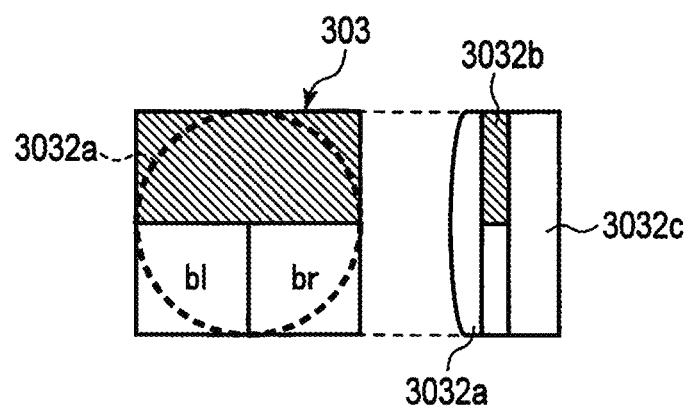
F I G. 4B

|     | m1  | m2  | m3  | m4  | m5  | m6  | m7  | m8  | m9  | m10 | m11 | m12 | m13 | m14 | m15 | m16 | m17 | m18 | m19 | m20 |
|-----|-----|-----|-----|-----|-----|-----|-----|-----|-----|-----|-----|-----|-----|-----|-----|-----|-----|-----|-----|-----|
| n1  | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n2  | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n3  | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n4  | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |
| n5  | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n6  | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n7  | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n8  | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |
| n9  | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n10 | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n11 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n12 | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |
| n13 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n14 | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n15 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n16 | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |
| n17 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n18 | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n19 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n20 | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |
| n21 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n22 | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n23 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n24 | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |
| n25 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n26 | Gbl | Gbr | tl  | tr  | Gbl | Gbr | Bl  | Br  | Gbl | Gbr | bl  | br  | Gbl | Gbr | Bl  | Br  | Gbl | Gbr | Bl  | Br  |
| n27 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n28 | Gbl | Gbr | Bl  | Br  | Gbl | Gbr | Bl  | Br  | Gbl | Gbr | Bl  | Br  | Gbl | Gbr | Bl  | Br  | Gbl | Gbr | tl  | tr  |

FIG. 5

|     | m1  | m2  | m3  | m4  | m5  | m6  | m7  | m8  | m9  | m10 | m11 | m12 | m13 | m14 | m15 | m16 | m17 | m18 | m19 | m20 |
|-----|-----|-----|-----|-----|-----|-----|-----|-----|-----|-----|-----|-----|-----|-----|-----|-----|-----|-----|-----|-----|
| n1  | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n2  | Gbl | Gbr | t   | t   | Gbl | Gbr | Bl  | Br  | Gbl | Gbr | b   | b   | Gbl | Gbr | Bl  | Br  | Gbl | Gbr | Bl  | Br  |
| n11 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n12 | Gbl | Gbr | Bl  | Br  | Gbl | Gbr | Bl  | Br  | Gbl | Gbr | Bl  | Br  | Gbl | Gbr | Bl  | Br  | Gbl | Gbr | t   | t   |
| n21 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n22 | Gbl | Gbr | t   | t   | Gbl | Gbr | Bl  | Br  | Gbl | Gbr | b   | b   | Gbl | Gbr | Bl  | Br  | Gbl | Gbr | Bl  | Br  |
| n31 | Rl  | Rr  | Grl | Grr | Rl  | Rr  | Grl | Grr | Rl  | Rr  | Grl | Grr | Rl  | Rr  | Grl | Grr | Rl  | Rr  | Grl | Grr |
| n32 | Gbl | Gbr | Bl  | Br  | Gbl | Gbr | Bl  | Br  | Gbl | Gbr | Bl  | Br  | Gbl | Gbr | Bl  | Br  | Gbl | Gbr | t   | t   |

FIG. 9

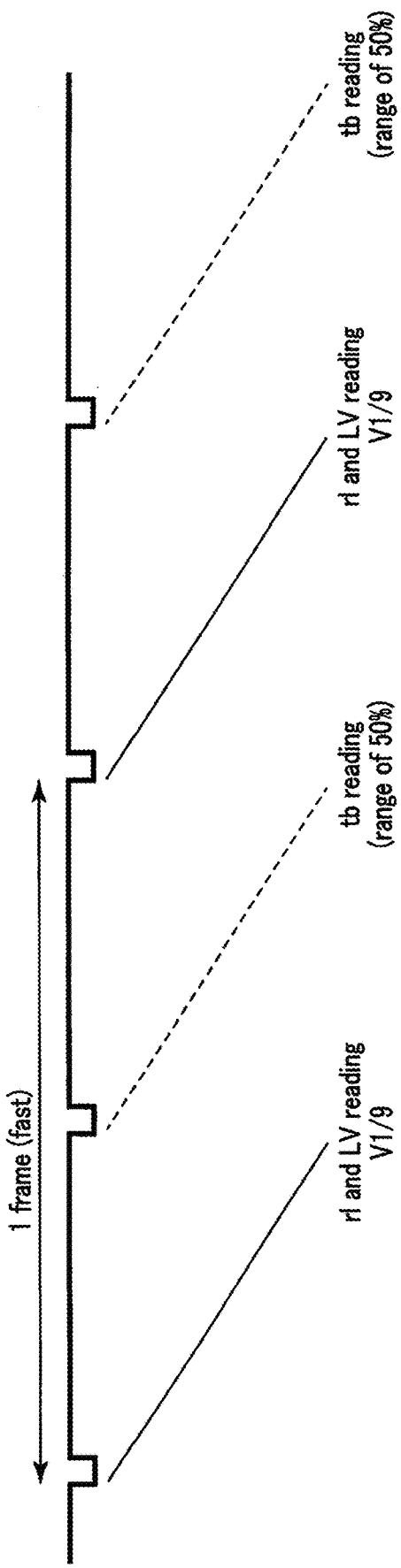
F I G. 12

FIG. 13

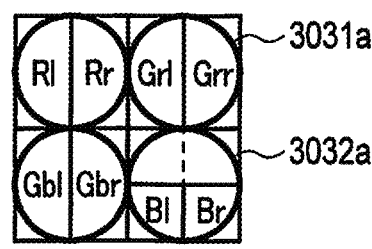
F I G. 14A
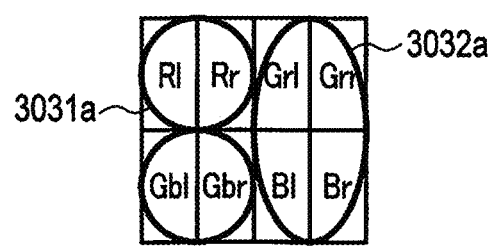
F I G. 14B

IMAGING ELEMENT AND IMAGING DEVICE

CROSS-REFERENCE TO RELATED APPLICATIONS

This application is based upon and claims the benefit of priority from the prior Japanese Patent Applications No. 2017-238348, filed Dec. 13, 2017, the entire contents of which are incorporated herein by reference.

BACKGROUND OF THE INVENTION

1. Field of the Invention

The present invention relates to an imaging element and an imaging device including the same.

2. Description of the Related Art

An imaging element configured to be capable of performing focus detection by a phase difference method is known. As such an imaging element, an imaging element which obtains a pixel signal for focus detection by a focus detection pixel in which a part of a light receiving region is shielded, an imaging element which configures one pixel by a plurality of light receiving portions in which pupil splitting is made in at least one of a horizontal direction and a vertical direction as disclosed in Jpn. Pat. Appln. KOKAI Publication No. 2015-46761 and obtains a pixel signal for focus detection based on pixel signals output from each of the light receiving portions configuring the pixel, and the like have been known.

BRIEF SUMMARY OF THE INVENTION

According to an aspect of the invention, there is provided an imaging element, comprising: a plurality of microlenses arranged in a first direction and a second direction; a plurality of first pixel portions each corresponding to one of the microlenses and including first light receiving portions being pupil-split in the first direction; and a plurality of second pixel portions each corresponding to one of the microlenses and including second light receiving portions being pupil-split in the first direction, the second light receiving portions including a light receiving region and a non-light receiving region along the second direction, wherein the first pixel portions are arranged in the first direction and the second direction, and the second pixel portions are substituted for some of the first pixel portions and are adjacently or discretely arranged in the second direction.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing an example of a configuration of an imaging device according to an embodiment of the present invention;

FIG. 2 is a diagram showing one example of a configuration of an imaging element;

FIG. 3 is a diagram showing a detailed configuration of a first pixel portion;

FIG. 4A is a diagram showing a configuration of a second pixel portion in which a lower light receiving region is shielded;

FIG. 4B is a diagram showing a configuration of a second pixel portion in which an upper light receiving region is shielded;

FIG. 5 is a diagram showing an arrangement of the first pixel portion and the second pixel portion;

FIG. 9 is a diagram showing reading of a pixel signal of a base portion and a pixel signal of a reference portion in rl and LV reading;

FIG. 12 is a timing chart when the high-speed reading is performed in the reading processing for the AF and LV display;

FIG. 13 is a view showing a modified example in which filters having a different color are formed in a second pixel portion;

FIG. 14A is a diagram showing a first modified example of the second pixel portion; and FIG. 14B is a diagram showing a second modified example of the second pixel portion.

DETAILED DESCRIPTION OF THE INVENTION

Figure 6A:
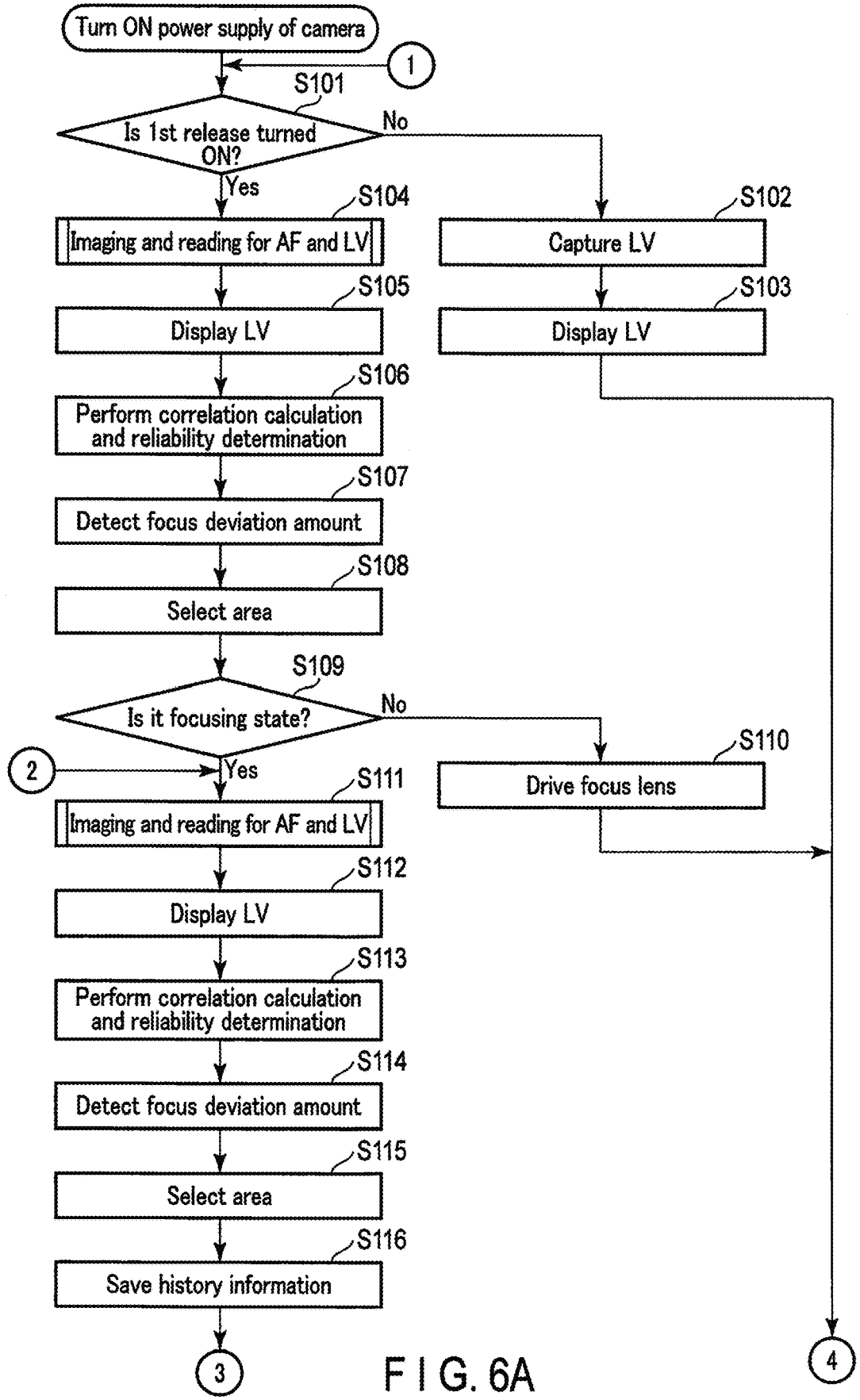
FIG. 6A is a flowchart showing an operation of the imaging device according to an embodiment of the present invention.

Hereinafter, embodiments of the present invention will be described with reference to the drawings. FIG. 1 is a block diagram showing an example of a configuration of an imaging device according to an embodiment of the present invention. In FIG. 1, solid lines with an arrow each indicate a flow of data, and broken lines with an arrow each indicate a flow of control signals.

As shown in FIG. 1, an imaging device 1 includes an interchangeable lens 100 and a camera body 200. The interchangeable lens 100 is configured to be detachable from the camera body 200. The interchangeable lens 100 and the camera body 200 are connected to each other so that they can communicate with each other when the interchangeable lens 100 is mounted on the camera body 200. The imaging device 1 is not necessarily a lens interchangeable imaging device. For example, the imaging device 1 may be a lens integrated imaging device.

The interchangeable lens 100 includes an imaging optical system 102, a driver 104, a lens CPU 106, and a storage 108. In this configuration, each block of the interchangeable lens 100 is constituted by hardware, for example. However, each block of the interchangeable lens 100 is not necessarily constituted by hardware, and a part thereof may be constituted by software. In addition, each block of the interchangeable lens 100 may not be constituted by single hardware or software, and may be constituted by a plurality of pieces of hardware or software.

The imaging optical system 102 is an optical system for forming a luminous flux from a subject on the imaging element 208 of the camera body 200. The imaging optical system 102 includes a focus lens 1021 and an aperture 1022. The focus lens 1021 is configured to be able to adjust a focal position of the imaging optical system 102 by moving in an optical axis direction.

The aperture 1022 is arranged on an optical axis of the focus lens 1021. An aperture diameter of the aperture 1022 is variable. The aperture 1022 adjusts the amount of luminous flux from the subject which passes through the focus lens 1021 and is incident on the imaging element 208. The driver 104 drives the focus lens 1021 and the aperture 1022 based on a control signal output from the lens CPU 106. The imaging optical system 102 may be configured as a zoom lens. In this case, the driver 104 also performs zoom driving.

The lens CPU 106 is configured to be able to communicate with the CPU 212 of the camera body 200 via an interface (I/F) 110. The lens CPU 106 controls the driver 104 according to the control of the CPU 212 of the camera body 200. In addition, the lens CPU 106 transmits information such as an aperture value (F-number) of the aperture 1022 and information such as lens information stored in the storage 108 to the CPU 212 via the I/F 110. The lens CPU 106 may not necessarily be configured as a CPU. That is, the lens CPU 106 may be replaced with an ASIC, an FPGA, or the like. In addition, the same function as the lens CPU 106 may be realized by software.

The storage 108 stores the lens information regarding the interchangeable lens 100. The lens information includes, for example, information on a focal length of the imaging optical system 102 and information on aberrations.

The camera body 200 includes a mechanical shutter 202, a driver 204, an operation unit 206, an imaging element 208, an image stabilization circuit 210, a CPU 212, an image processor 214, an image compression/expansion circuit 216, a focus detection circuit 218, an exposure control circuit 220, a display 222, a bus 224, a DRAM 226, a storage 228, and a recording medium 230. Each block of the camera body 200 is constituted by hardware, for example. However, each block of the camera body 200 is not necessarily constituted by hardware, and a part thereof may be constituted by software. In addition, each block of the camera body 200 may not be constituted by single hardware or software, and may be constituted by a plurality of pieces of hardware or software.

The mechanical shutter 202 is configured to be freely open and closed and adjusts an incident time of the luminous flux from the subject to the imaging element 208. The incident time corresponds to an exposure time of the imaging element 208. As the mechanical shutter 202, for example, a focal plane shutter is adopted. The driver 204 drives the mechanical shutter 202 based on the control signal from the CPU 212.

The operation unit 206 includes various operation buttons such as a power button, a release button, a movie image button, a play button, a menu button, and various operation members such as a touch panel. The operation unit 206 detects an operation state of various operation members and outputs a signal indicating the detected result to the CPU 212.

The imaging element 208 is arranged behind the mechanical shutter 202 on the optical axis of the imaging optical system 102 and is arranged at a position where the luminous flux from the subject is formed by the imaging optical system 102. The imaging element 208 images the subject to generate a pixel signal related to the subject. The imaging element 208 will be described later in detail.

The image stabilization circuit 210 moves the imaging element 208 in a direction parallel to its light receiving surface so as to suppress camera shake occurring in the camera body 200. As the imaging element 208 is moved according to the camera shake, blurring of a subject image occurring in image data due to camera shake is suppressed. The image stabilization circuit may be provided in the interchangeable lens 100. In this case, the image stabilization circuit is configured to move the image stabilization optical system in the imaging optical system 102.

The CPU 212 performs the overall control of the camera body 200 according to programs stored in the storage 228. The CPU 212 causes, for example, the imaging element 208 to control an image. In addition, the CPU 212 outputs a control signal for driving the focus lens 1021 to the lens CPU 106 according to the focused state of the focus lens 1021 detected by the focus detection circuit 218. Further, the CPU 212 outputs an exposure setting value calculated by the exposure control circuit 220 to the lens CPU 106 and the imaging element 208. Here, the CPU 212 may not necessarily be configured as a CPU. That is, the CPU 212 may be replaced with an ASIC, an FPGA, or the like. In addition, the same function as the CPU 212 may be realized by software.

The image processor 214 performs various kinds of image processing on pixel data. For example, the image processor 214 performs image processing for still image recording to generate still image data at the time of photographing a still image. Similarly, the image processor 214 performs image processing for movie image recording to generate movie image data at the time of photographing a movie image. Further, at the time of live view display, the image processor 214 performs image processing for display to generate display image data.

The image compression/expansion circuit 216 compresses the still image data or the movie image data which are image data generated by the image processor 214 at the time of recording image data. In addition, the image data recorded in the compressed state on the recording medium 230 are expanded at the time of reproducing the image data.

The focus detection circuit 218 performs the focus detection of the focus lens 1021 by a known phase difference method using focus detection pixel data output from the imaging element 208.

The exposure control circuit 220 calculates the exposure setting value based on the pixel data of the imaging element 208. The exposure control circuit 220 measures luminance of a subject from the pixel data of the imaging element 208 and calculates the exposure setting value necessary for adjusting the luminance of the subject at the time of photographing to an appropriate value from the measured luminance of the subject. The exposure setting value includes an aperture value corresponding to an aperture amount of the aperture 1022 and a shutter speed corresponding to the exposure time of the imaging element 208.

The display 222 is, for example, a display such as a liquid crystal display or an organic EL display, and is arranged on, for example, a back surface of the camera body 200. The display 222 displays an image under the control of the CPU 212. The display 222 is used for the live view display, a display of recorded images, or the like.

The bus 224 is connected to the imaging element 208, the CPU 212, the image processor 214, the image compression/expansion circuit 216, the focus detection circuit 218, the exposure control circuit 220, the display 222, the DRAM 226, the storage 228, and the recording medium 230, and operates as a transfer path for transferring various data generated in the block.

The DRAM 226 is an electrically rewritable memory and temporarily stores various data such as pixel data, still image data, moving image data, and display image data which are output from the imaging element 208, and various data such as processing data in the CPU 212. The SDRAM may be used for temporary storage.

The storage 228 stores the programs used in the CPU 212, various data such as adjustment values of the camera body 200, and the like. The recording medium 230 is configured to be built in or loaded in the camera body 200, and records the image data for recording as a predetermined type of image file. The DRAM 226, the storage 228, and the recording medium 230 may each be constituted by one memory or the like, or may be configured by combining a plurality of memories or the like.

Next, the imaging element 208 will be described. FIG. 2 is a diagram showing one example of a configuration of the imaging element 208. As shown in FIG. 2, the imaging element 208 includes an input circuit 301, a control circuit 302, a pixel portion 303, a vertical scanning circuit 304, an analog processor 305, an analog to digital conversion (ADC) processing circuit 306, a memory circuit 307, a horizontal scanning circuit 308, and an output circuit 309. An imaging portion in the present embodiment is configured to include the pixel portion 303. The imaging portion may further include the vertical scanning circuit 304, the analog processor 305, the ADC processor 306, and the memory circuit 307. Further, the analog processor 305 and the ADC processor 306 may be provided outside the imaging element 208.

The input circuit 301 receives a control signal related to the operation of the imaging element 208 from the CPU 212 and inputs the control signal to the control circuit 302. The control signal related to this operation includes a synchronizing signal (vertical synchronizing signal and horizontal synchronizing signal), a reference clock, and a signal of operation setting of the imaging element 208.

The control circuit 302 is constituted by, for example, a CPU, ASIC or a logic circuit (digital circuit), and controls the operations of each portion of the imaging element 208 based on the control signal input from the input circuit 301.

The pixel portions 303 are two-dimensionally arranged and perform photoelectric conversion on incident light to generate pixel signals. In this embodiment, the pixel portion 303 includes a first pixel portion and a second pixel portion.

First, the first pixel portion will be described. FIG. 3 is a diagram showing a detailed configuration of a first pixel portion. Here, the left side of FIG. 3 shows the first pixel portion as seen from the front, and the right side of FIG. 3 shows the first pixel portion as seen from the side. As shown in FIG. 3, the first pixel portion includes microlenses 3031a, color filters 3031b, and pixels 3031c.

The microlens 3031a focuses the luminous flux passing through the imaging optical system 102 on the light receiving portion of the corresponding pixel 3031c. As will be described later, one pixel 3031c includes two light receiving portions which are pupil-split in the horizontal direction as a first direction. The microlens 3031a focuses the luminous flux passing through different exit pupil regions of the imaging optical system 102 on different light receiving portions.

The color filter 3031b is, for example, a color filter of Bayer array of a primary color. The Bayer array of the primary color is an arrangement in which rows in which a red (R) filter and a green (Gr) filter are alternately arranged and rows in which a blue (B) filter and a green (Gb) filter are alternately arranged in a column direction. One color of the color filter 3031b corresponds to one pixel 3031c. Therefore, light of the same color is incident on the two light receiving portions constituting the pixel 3031c. It is to be noted that the color filter 3031b may be the color filter of the Bayer array of the primary color.

The pixel 3031c includes two light receiving portions l and r which are divided and arranged in a horizontal direction as a first direction. The light receiving portions l and r receive the luminous flux emitted from the same portion of the subject. Each of the light receiving portions l and r is constituted by, for example, a photodiode, and outputs the pixel signal based on electric charges accumulated according to the received luminous flux. The light receiving portion l receives the luminous flux passing through the exit pupil region on the right side of the imaging optical system 102, among the emitted luminous fluxes. The light receiving portion r receives the luminous flux passing through the exit pupil region on the left side of the imaging optical system 102, among the emitted luminous fluxes.

By the structure in which the pixel 3031c is divided into two light receiving portions l and r, the pixel 3031c can be handled as left and right opening pixels for phase difference detection. The left and right opening pixels are pairs of pixels in which only the left side is exposed and pixels in which only the right side is exposed. In addition, the pixel 3031c can be handled as all opening pixels in which all the two light receiving portions l and r are combined. It can be set by the control signal from the control circuit 302 whether the pixel 3031c is handled as left and right opening pixels or all the opening pixels. In the case where the pixel 3031c is handled as all the opening pixels, the pixel 3031c is used as a pixel for photographing a still image not having phase difference information.

Next, a second pixel portion will be described. FIGS. 4A and 4B are diagrams showing a detailed configuration of a second pixel portion. The second pixel portion has a configuration in which an upper side or a lower side of the light receiving region is shielded in order to detect the phase difference in the vertical direction different from that of the first pixel portion. FIG. 4A shows a configuration of the second pixel portion in which the lower light receiving region is shielded, and FIG. 4B shows a configuration of the second pixel portion in which the upper light receiving region is shielded. Here, the left sides of FIGS. 4A and 4B show the second pixel portion as seen from the front, and the right sides of FIGS. 4A and 4B show the second pixel portion as seen from the side. As shown in FIGS. 4A and 4B, the second pixel portion includes microlenses 3032a, light shielding portions 3032b, and pixels 3032c. The difference between the first pixel portion and the second pixel portion is that the second pixel portion has the light shielding portion instead of having a color filter.

Like the microlens 3031a, the microlens 3032a focuses the luminous flux passing through the imaging optical system 102 on the light receiving portion of the corresponding pixel 3032c. As will be described later, like the pixel 3031c, the pixel 3032c as one example also includes two light receiving portions which are pupil-split in a horizontal direction which is a first direction. The microlens 3032a focuses the luminous flux passing through different exit pupil regions of the imaging optical system 102 on different light receiving portions.

The light shielding portion 3032b shields a part of the light receiving region formed by the light receiving portion of the pixel 3032c. The light shielding portion 3032b is formed of, for example, a light shielding metal which is formed to cover a part of the light receiving region of the pixel 3032c. The light shielding portion 3032b in FIG. 4A is configured to shield the light receiving region on the lower side of the pixel 3032c so as to form non-light receiving region and expose the light receiving region on the upper side of the pixel 3032c. In addition, the light shielding portion 3032b in FIG. 4B is configured to shield the light receiving region on the upper side of the pixel 3032c so as to form non-light receiving region and expose the light receiving region on the lower side of the pixel 3032c.

Like the pixel 3031c, the pixel 3032c includes two light receiving portions tl and tr or bl and br which are divided and arranged in the horizontal direction which is the first direction. The light receiving portions tl and tr receive the luminous flux emitted from the same portion of the subject. Similarly, the light receiving portions bl and br receive the luminous flux emitted from the same portion of the subject. Each of the light receiving portions is constituted by, for example, a photodiode, and outputs the pixel signal based on electric charges accumulated according to the received luminous flux. The light receiving portion tl receives the luminous flux passing through the exit pupil region on a lower right of the imaging optical system 102, among the emitted luminous fluxes. The light receiving portion tr receives the luminous flux passing through the exit pupil region on a lower left of the imaging optical system 102, among the emitted luminous fluxes. The light receiving portion bl receives the luminous flux passing through the exit pupil region on an upper right of the imaging optical system 102, among the emitted luminous fluxes. The light receiving portion br receives the luminous flux passing through the exit pupil region on an upper left of the imaging optical system 102, among the emitted luminous fluxes. Hereinafter, if necessary, the light receiving portions tl and tr in which the upper side shown in FIG. 4A is the light receiving region are collectively referred to as a light receiving portion t and the light receiving portion bl and br in which the lower side shown in FIG. 4B is a light receiving region are collectively referred to as a light receiving portion b.

The pixel 3032c having the light receiving portion t can be handled as a top opening pixel for phase difference detection. In addition, the pixel 3032c having the light receiving portion b can be handled as a bottom opening pixel for phase difference detection.

FIG. 5 is a diagram showing an arrangement of the first pixel portion and the second pixel portion. "R", "Gr", "Gb", and "B" in FIG. 5 indicate the light receiving portions constituting the first pixel portion. Here, "l" attached to "R", "Gr", "Gb", and "B" indicates the light receiving portion l, and "r" indicates the light receiving portion r. In the case of the Bayer array, rows in which a pair of light receiving portions Rl and Rr and a pair of light receiving portions Grl and Grr are alternately arranged and rows in which a pair of light receiving portions Gbl and Gbr and a pair of light receiving portions Bl and Br are alternately arranged are alternately arranged in a column direction.

On the other hand, "tl", "tr", "bl", and "br" in FIG. 5 indicate the light receiving portions of the second pixel portion. As shown in FIG. 5, the second pixel portions are discretely arranged at positions of some of B pixels. The light receiving portion t (the light receiving portion tl and the light receiving portion tr) is arranged at an interval of eight pixel portions in the row direction. In the example of FIG. 5, the light receiving portions t are arranged in 3rd and 4th columns and 19th and 20th columns. The light receiving portions t arranged in the 19th and 20th columns are deviated and arranged downward by two rows with respect to the light receiving portions t arranged in the 3rd and 4th columns. In addition, the light receiving portions t are arranged at an interval of four pixel portions even in the column direction. On the other hand, the light receiving portions b (the light receiving portion bl and the light receiving portion br) are arranged at an interval of four pixel portions in the row direction with respect to the light receiving portions t. In the example of FIG. 5, the light receiving portions b are arranged in 11th and 12th columns. In addition, although not shown in FIG. 5, the light receiving portions b are also arranged in 27th and 28th columns at an interval of four pixel portions from the 19th and 20th columns. The light receiving portions b arranged in the 27th and 28th columns are deviated and arranged downward by two rows with respect to the light receiving portions b arranged in the 11th and 12th columns. In addition, the light receiving portions b are arranged at an interval of four pixel portions even in the column direction.

Here, in FIG. 5, the second pixel portions are discretely arranged at the positions of the B pixels, but may be arranged adjacently. In addition, the second pixel portions are arranged at positions of some of the B pixels, but the second pixel portions may be arranged at positions of some of R pixels.

In such an imaging element 208, the focus detection in the horizontal direction can be performed by the pair of light receiving portion l and light receiving portion r. In addition, the focus detection in the vertical direction can be performed by the pair of light receiving portion t and light receiving portion b. As described above, the pair of light receiving portions t in the 19th and 20th columns and light receiving portions b in the 27th and 28th columns are deviated and arranged downward by two rows with respect to the pair of light receiving portions t in the 3th and 4th columns and light receiving portions b in the 11th and 12th columns. By such a configuration, it is possible to improve the phase difference detection performance in the vertical direction by increasing the number of top and bottom opening pixels on appearance.

Each time the vertical scanning circuit 304 receives an accumulation start signal as the control signal from the control circuit 302, the vertical scanning circuit 304 resets electric charges accumulated in a pixel 303c of the pixel portion 303, and then starts accumulating the electric charges in the pixel portion 303 row by row. Further, each time the vertical scanning circuit 304 receives an accumulation end signal as the control signal from the control circuit 302, the vertical scanning circuit 304 ends the accumulation of electric charges in the pixel 303c of the pixel portion 303 row by row, and transfers the accumulated electric charge as the pixel signal to the analog processor 305.

The analog processor 305 performs the analog processing on the pixel signals sequentially transferred from the pixel portion 303. The analog processor 305 includes, for example, a preamplifier which amplifies the pixel signal in an analog manner, a correlated double sampling (CDS) processing circuit which removes reset noise from the pixel signal, and the like.

The ADC processor 306 converts the pixel signal output from the analog processor 305 into pixel data which is a digital signal according to the control signal from the control circuit 302. The ADC processor 306 is configured as a column type ADC processor, for example.

The memory circuit 307 temporarily stores the pixel data output from the ADC processor 306 according to the control signal from the control circuit 302. The memory circuit 307 is constituted by a volatile memory or the like. The memory circuit 307 may be configured to perform digital addition of the pixel data. In this case, the memory circuit 307 is configured to store an added value of the pixel data output from the ADC processor 306.

The horizontal scanning circuit 308 receives the control signal from the control circuit 302 and transfers the pixel data stored in the memory circuit 307 to an output circuit 309 in column order.

The output circuit 309 arranges the pixel data transferred by the horizontal scanning circuit 308 to generate a pixel data string. In addition, the output circuit 309 converts the pixel data string into predetermined output signal types such as a serial signal and a differential signal, and outputs the converted signals.

Figure 6B:
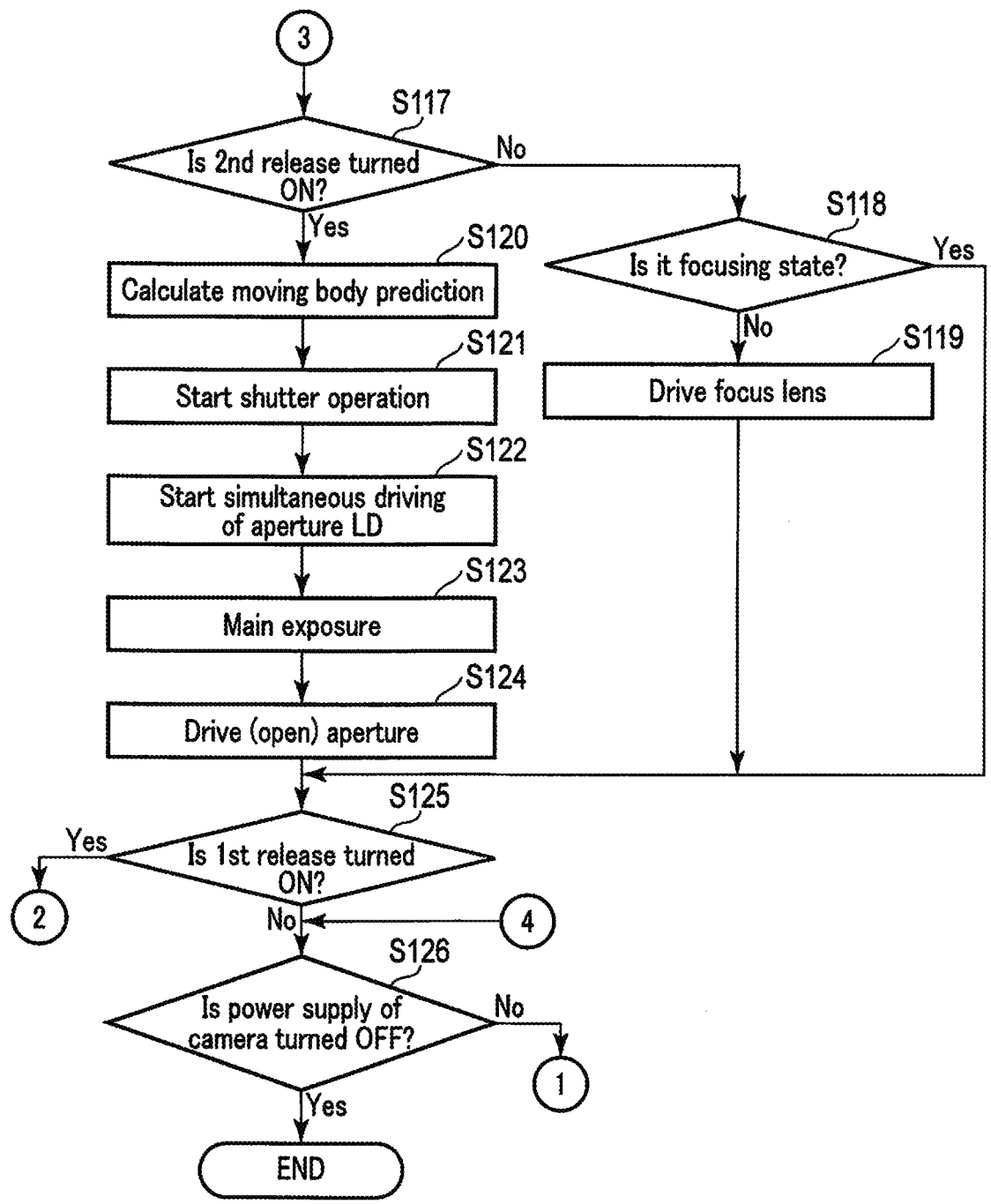
FIG. 6B is a flowchart showing the operation of the imaging device according to an embodiment of the present invention.

Hereinafter, the operation of the imaging device 1 according to the present embodiment will be described. FIGS. 6A and 6B are flowcharts showing the operation of the imaging device according to the present embodiment. Here, FIGS. 6A and 6B show the operation when an AF mode of the imaging device 1 is a continuous AF mode. The continuous AF mode is an AF mode suitable for a moving subject, and is an AF mode in which focusing is continued so as to follow up a subject.

The operations in FIGS. 6A and 6B start when a turn on operation of a power supply of the imaging device 1 by a user is detected. When the turn on operation of the power supply is detected, in step S101, the CPU 212 determines whether a 1st release switch of a release button is turned on. The 1st release switch is a switch which is turned on in response to a half press operation of the release button by the user, for example. If it is determined in step S101 that the 1st release switch is in a turn on state, processing proceeds to step S104. If it is determined in step S101 that the 1st release switch is not in the turn on state, processing proceeds to step S102.

In step S102, the CPU 212 starts to capture display pixel data for live view (LV) display. At this time, the CPU 212 outputs the control signal to the driver 204 so as to allow the mechanical shutter 202 to be in a fully opened state, and outputs the control signal to the lens CPU 106 so as to drive the aperture 1022 by a predetermined amount (for example, an open aperture). Thereafter, the CPU 212 outputs the control signal to the imaging element 208 to cause the imaging element 208 to start imaging for LV display. Each time the imaging for the LV display is completed, the control circuit 302 starts reading the pixel signals from the pixel portions 303. Upon reading the pixel signals, the control circuit 302 may add the pixel signals of the same aperture (same color) output from the pixels 303c of the pixel portions 303. The display pixel data output from the imaging element 208 is stored in the DRAM 226.

In step S103, the CPU 212 performs the LV display. At this time, the CPU 212 causes the image processor 214 to generate display image data. In response to this, the image processor 214 performs necessary processing on the display pixel data to generate the display image data for display. The display image data at the position of the first pixel portion are obtained by calculating arithmetic mean of the pixel data from the light receiving portions l and r belonging to the same first pixel portion. In addition, the display image data at the position of the second pixel portion is obtained by performing interpolation calculation using the pixel data from the first pixel portion of the same color (B in the example of FIG. 5) around the second pixel portion. The CPU 212 displays the LV image on the display 222 based on the display image data generated by the image processor 214. Thereafter, the processing proceeds to step S126.

In step S104, the CPU 212 performs the imaging and reading for the autofocus (AF) and the LV display. The imaging and reading processing for the AF and the LV display in step S104 will be described below in detail. Here, the description is continued under the assumption that the focus detection pixel data for AF are stored in the DRAM 226 by the imaging and reading for the AF, and the display pixel data for display are stored in the DRAM 226 by the imaging and reading for the LV.

In step S105, the CPU 212 performs the LV display.

In step S106, the CPU 212 causes the focus detection circuit 218 to perform a focus detection calculation. The focus detection circuit 218 performs a correlation calculation using a pair of focus detection pixel data of a base portion and focus detection pixel data of a reference portion of the focus detection pixel data stored in the DRAM 226. In the case of the phase difference detection in the horizontal direction, the pair of focus detection pixel data is the left opening pixel data l and the right opening pixel data r, and in the case of the phase difference detection in the vertical direction, the pair of focus detection pixel data is the top opening pixel data t and the bottom opening pixel data b. After the correlation calculation, the focus detection circuit 218 determines the reliability of the focus detection. The reliability determination is made based on, for example, contrast obtained from the pixel data or a correlation value calculated as the result of the correlation calculation.

In step S107, the focus detection circuit 218 performs a focus deviation amount calculation. That is, as a result of the reliability determination in step S106, the focus detection circuit 218 calculates the focus deviation amount with respect to a focusing position of the focus lens 1021 from a two-image interval value in the focus detection region which is determined as having high reliability. The two-image interval value is an image deviation amount corresponding to an extreme value of the correlation value. Thereafter, the processing proceeds to step S108.

In step S108, the focus detection circuit 218 performs area selection processing for selecting the focus detection region corresponding to the focus lens position used for driving the focus lens 1021. After the area selection processing, the processing proceeds to step S109. The area selection processing is performed, for example, by selecting the focus detection region indicating the focus deviation amount corresponding to the focus lens position corresponding to the closest subject distance.

In step S109, the CPU 212 determines whether the focus lens 1021 is in a focusing state. The determination in step S109 is performed, for example, by determining whether the focus deviation amount in the focus detection region selected in the area selection processing is within a predetermined permissible range. When the focus deviation amount is within the permissible range, it is determined that the focus lens 1021 is in the focusing state. If it is determined in step S109 that the focus lens 1021 is not in the focusing state, the processing proceeds to step S110. If it is determined in step S109 that the focus lens 1021 is in the focusing state, the processing proceeds to step S111.

In step S110, the CPU 212 outputs the control signal to the lens CPU 106 so that the focus lens 1021 is driven according to the focus lens position calculated for the focus detection region selected in step S108. In response to the control signal, the lens CPU 106 receives the control signal and drives the focus lens 1021 via the driver 104. Thereafter, the processing proceeds to step S126.

Like in step S104, in step S111, the CPU 212 performs the imaging and reading for the autofocus (AF) and the LV display. Here, the description is continued under the assumption that the focus detection pixel data are stored in the DRAM 226 by the imaging and reading for the AF, and the display pixel data are stored in the DRAM 226 by the imaging and reading for the LV.

In step S112, the CPU 212 performs the LV display.

In step S113, the CPU 212 causes the focus detection circuit 218 to perform a focus detection calculation. The focus detection circuit 218 performs the correlation calculation using the pair of focus detection pixel data among the focus detection pixel data stored in the DRAM 226. After the correlation calculation, the focus detection circuit 218 determines the reliability of the focus detection. In step S114, the focus detection circuit 218 performs the focus deviation amount calculation. In step S115, the focus detection circuit 218 performs the area selection processing.

In step S116, the focus detection circuit 218 stores the information on the focus detection as history information in the DRAM 226, for example. The information on the focus detection includes, for example, the information on the focus deviation amount calculated in step S114 and the information on the focus detection region selected in step S115.

In step S117, the CPU 212 determines whether a 2nd release switch is turned on. The 2nd release switch is a switch which is turned on in response to a full press operation of the release button by the user, for example. If it is determined in step S117 that the 2nd release switch is not in a turn on state, processing proceeds to step S118. If it is determined in step S117 that the 2nd release switch is in the turn on state, processing proceeds to step S120.

In step S118, the CPU 212 determines whether the focus lens 1021 is in a focusing state. If it is determined in step S118 that the focus lens 1021 is not in the focusing state, the processing proceeds to step S119. If it is determined in step S118 that the focus lens 1021 is in the focusing state, the processing proceeds to step S125.

In step S119, the CPU 212 outputs the control signal to the lens CPU 106 so that the focus lens 1021 is driven according to the focus lens position calculated for the focus detection region selected in step S115. In response to the control signal, the lens CPU 106 drives the focus lens 1021 via the driver 104. Thereafter, the processing proceeds to step S125.

In step S120, the CPU 212 causes the focus detection circuit 218 to perform a moving object prediction calculation. In response to this, the focus detection circuit 218 performs the moving object prediction calculation. The moving object prediction calculation is processing for predicting the current driving position of the focus lens 1021 from the history of the focus lens position which is the result of the previous focus deviation amount calculation stored in step S116.

In step S121, the CPU 212 starts the operation of the mechanical shutter 202 in order to perform the main exposure which is the imaging for acquiring a still image. The operation of the mechanical shutter 202 includes an opening and closing operation of the mechanical shutter 202 before and after the main exposure and a full opening operation of the mechanical shutter 202 for starting the live view and the imaging for the AF after the main exposure. First, the CPU 212 switches the control signal of the driver 204 so that the mechanical shutter 202 is in the fully closed state. After performing the main exposure in step S123, the CPU 212 controls the driver 204 so that the mechanical shutter 202 is in the fully open state.

In step S122, the CPU 212 instructs the lens CPU 106 to drive the focus lens 1021 and the aperture 1022 at the same time to thereby start the operation. Here, the driving position of the focus lens 1021 is the position predicted in the moving object prediction calculation in step S120. In addition, the opening amount of the aperture 1022 is an opening amount corresponding to the aperture value calculated based on luminance of a subject measured by the immediately preceding photometric calculation.

In step S123, the CPU 212 starts the main exposure. The main exposure is imaging for acquiring image data for recording. In the main exposure, the CPU 212 causes the imaging element 208 to start the imaging. After the exposure period ends, the control circuit 302 reads the pixel signals from each light receiving portion of the imaging element 208 as the still image pixel signal. The reading of the still image pixel signal will be described below in detail. Here, the description will be continued on the assumption that the still image pixel signal is read. After reading the still image pixel signal, the CPU 212 causes the image processor 214 to perform processing for generating an image pixel signal for recording. In response to this, the image processor 214 performs processing necessary to generate the image data for recording so as to generate the still image data for recording. After the image processing is completed, the CPU 212 causes the image compression/expansion circuit 216 to compress the still image data for recording. After the compression is completed, the CPU 212 records the compressed still image data for recording on the recording medium 230 as an image file.

In step S124, the CPU 212 instructs the lens CPU 106 to open the aperture 1022.

In step S125, the CPU 212 determines whether the 1st release switch is in the turn on state. If it is determined in step S125 that the 1st release switch is in the turn on state, processing returns to step S111. Thereafter, if the 2nd release switch is in the turn on state, the still image photographing is continuously performed. If it is determined in step S125 that the 1st release switch is not in the turn on state, processing proceeds to step S126.

In step S126, the CPU 212 determines whether to turn off the power supply of the camera body 200. For example, when the turn off of the power supply is instructed by the operation unit 206 of the user or when there is no operation of the operation unit 206 of the user for a predetermined time, it is determined that the power supply is turned off. If it is determined in step S126 that the power supply of the camera body 200 is not turned off, processing returns to step S101. If it is determined in step S126 that the power supply of the camera body 200 is turned off, the processing ends.

Next, the reading of the pixel signal will be described. First, the reading of the still image pixel signal at the time of the main exposure will be described. When a continuous shooting speed is slow, it can take time to read the still image pixel signal. At this time, the control circuit 302 switches the setting of the pixel portion 303 so that the pixel signals from the two light receiving portions of each pixel portion shown in FIG. 5 are output without being added. Therefore, the still image pixel signal of the arrangement shown in FIG. 5 is digitized and stored in the DRAM 226 as a RAW image. The pixel signals of the light receiving portion t and the light receiving portion b cannot be used as the still image as they are. Therefore, when the still image is produced by performing developing processing on the RAW image, the pixel signals of the light receiving portion t and the light receiving portion b are interpolated by the interpolation calculation using the pixel signals of the light receiving portion of the surrounding same color.

Figure 7:
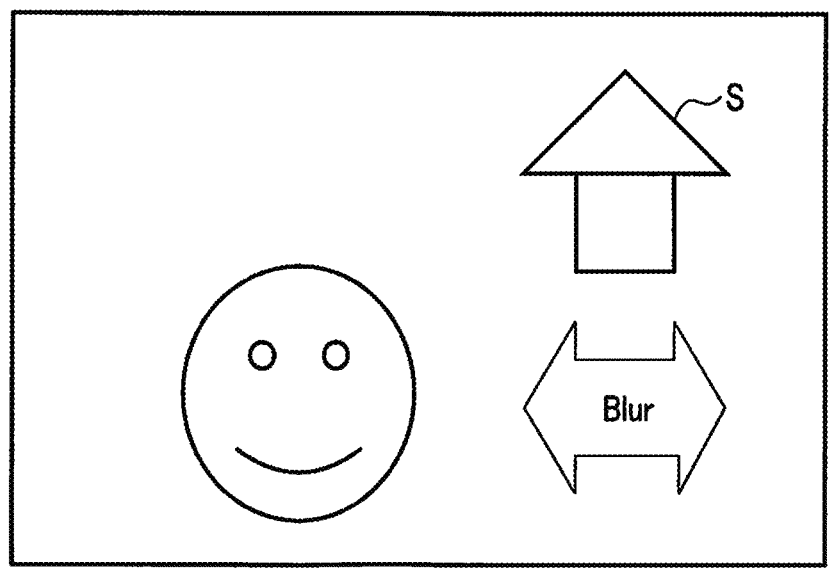
FIG. 7 is a diagram showing an outline of changing a position of a blur image using a left opening image and a right opening image.

In this manner, by not adding the pixel signal of the light receiving portion l and the pixel signal of the light receiving portion r, the still image pixel signal (RAW image) is formed to include both of the left opening image based on the pixel signal of the light receiving portion l and the right opening image based on the pixel signal of the light receiving portion r. Therefore, it is possible to detect the focusing position within the still image using the left opening image and the right opening image. In addition, by using these left opening image and right opening image, the focus position can be slightly deviated within the still image. For example, a method for slightly deviating a focus position by a weighting addition of pixel values of a left opening pixel and a right opening pixel, an addition of pixel values of left opening pixels and right opening pixels of different microlenses, or the like are used. FIG. 7 shows an image of a display with a touch panel including a user interface for adjusting a blur amount of a photographed still image. As shown in FIG. 7, for example, a position of a subject S is touched to select an image region and then an arrow portion is touched to slide left and right, thereby making it possible to slightly deviate a blur amount of a blurred image S.

Here, reading the still image pixel signal when the continuous shooting speed is slow can be used for reading the still image pixel signal in the case of single shooting. In addition, when the continuous shooting speed is fast and it cannot take time to read the still image pixel signal, the control circuit 302 switches the setting of the pixel portion 303 so that the two light receiving portions l and r are added and output.

Figure 8:
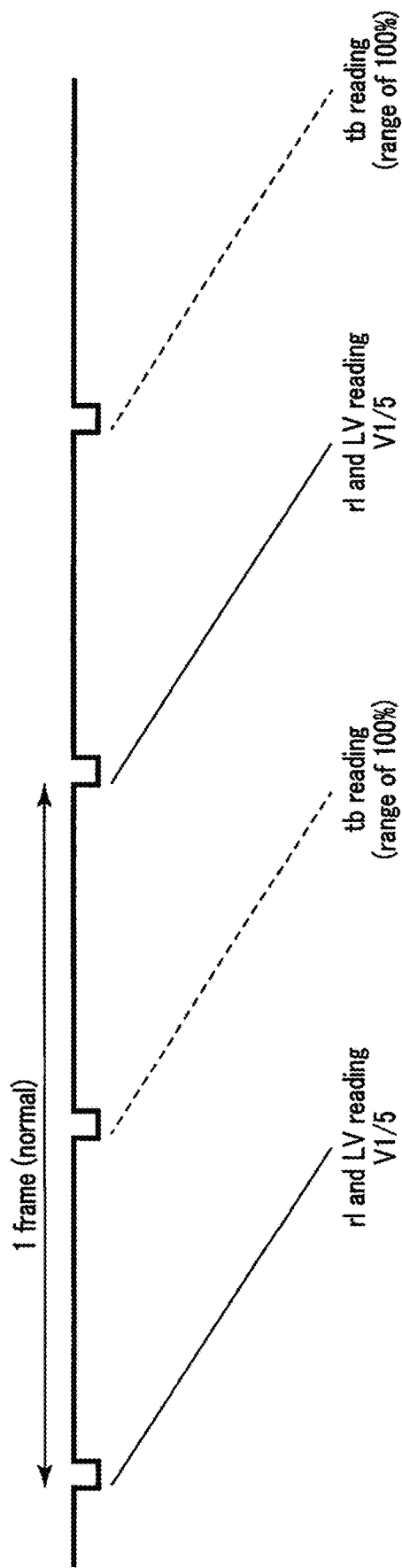
FIG. 8 is a timing chart for describing reading processing for AF and LV display.

Next, the reading processing for the AF and the LV display will be described. FIG. 8 is a timing chart for explaining the reading processing for the AF and the LV display in steps S104 and S111. "rl and LV reading" in FIG. 8 is a reading operation for generating the display pixel signal and the focus detection pixel signal in the horizontal direction which is the first direction. "tb reading" is a reading operation for generating the focus detection pixel signal in the vertical direction which is the second direction. In a continuous mode, as shown in FIG. 8, the rl and LV reading and the tb reading are performed once during one frame. A length of one frame is determined according to an update interval of a screen of the LV display, the continuous shooting speed representing the continuous shooting interval at the time of the continuous shooting, and the like.

Here, the setting of the pixel addition during the reading processing will be described. In the following description, the setting of the pixel addition in the pixel portion 303 is represented by adding "H" representing the horizontal direction or "V" representing the vertical direction to n/m. Here, n is the number of pixel signals used for addition. Further, m is the number of pixel signals to be added. For example, V1/5 pixel addition indicates adding one of pixel signals of five same openings arranged in the vertical direction, that is, reading only one of five pixel signals, and thinning out the remaining four pixel signals. In addition, V1/1 pixel addition indicates reading the pixel signals without performing the addition and thinning out in the vertical direction. In addition, H1/1 pixel addition indicates reading the pixel signals without performing the addition and thinning out in the horizontal direction.

In the rl and LV reading, the control circuit 302 switches the setting of the pixel portion 303 so that the left opening pixel signal l (Rl, Grl, Gbl, and Bl) and the right opening pixel signal r (Rr, Grr, Gbr, and Br) are output from the pixel portion 303. In addition, the control circuit 302 performs the setting of the pixel addition between the pixel portions 303 in order to shorten the reading time of the pixel signal.

Here, the same light is incident on the pupil-divided light receiving portions l and r. In this case, there is no positional deviation between the pixel signal of the base portion and the pixel signal of the reference portion. Therefore, in the first direction, a pair of pixel signals output from each of the light receiving portions l and r becomes one element (EL) for one focus detection region. The phase difference detection in the horizontal direction in one focus detection region is performed by a plurality of elements. In this manner, the phase difference detection performance can be improved by increasing the number of elements.

In the rl and LV reading in this embodiment, the pixel portion 303 is set so that the addition is not performed in the horizontal direction as the first direction but the addition is performed only in the vertical direction as the second direction. For example, the pixel portion 303 is set so that 1/1 pixel addition (that is, without addition) is performed on the pixel signals of the same openings (left opening or right opening) in the horizontal direction and 1/5 pixel addition is performed on the pixel signals of the same openings (left opening or right opening) in the vertical direction. The addition number of the pixel signals is appropriately set according to the frame rate, for example.

FIG. 9 is a diagram showing reading of the pixel signal of the base portion (left opening pixel signal) and the pixel signal (right opening pixel signal) of the reference portion in the rl and LV reading. At the time of the reading, as shown in FIG. 9, a pixel signal BA of the base portion including the pixel signal of the left opening pixel and a pixel signal RE of the reference portion including the pixel signal of the right opening pixel are read alternately (zigzag). On the other hand, 1/5 pixel addition is read in the vertical direction. As a result, S/N can be improved without degrading the phase difference detection performance in the horizontal direction. In addition, when the reading is performed as shown in FIG. 9, a pixel density in the correlation calculation direction in the horizontal direction which is the first direction is four times a pixel density in the correlation calculation direction in the vertical direction which is the second direction. Therefore, the phase difference detection accuracy in the horizontal direction is also four times the phase difference detection accuracy in the vertical direction.

The pixel signal read from the pixel portion 303 are subjected to analog processing in the analog processor 305. The pixel signal which is subjected to the analog processing is converted into the pixel data which is a digital signal in the ADC processor 306. The pixel data is stored in the memory circuit 307.

The horizontal scanning circuit 308 receives the control signal from the control circuit 302 and transfers the pixel data stored in the memory circuit 307 to an output circuit 309 in column order. The output circuit 309 arranges the pixel data transferred by the horizontal scanning circuit 308 to generate the pixel data string, and converts the generated pixel data string into a predetermined output signal type such as a serial signal and a differential signal and outputs the signal.

The pixel data string stored in the DRAM 226 by the rl and LV reading is used for the correlation calculation for calculating the focus deviation amount. The focus detection circuit 218 performs the correlation operation using the pair of left opening pixel data Grl and right opening pixel data Grr and the pair of left opening pixel data Gbl and right opening pixel data Gbr stored in the DRAM 226.

The pixel data string stored in the DRAM 226 by the rl and LV reading is used for the LV display. As described above, the display image data is obtained by calculating arithmetic mean of the pixel data of the light receiving portions l and r belonging to the same pixel portion 303. Therefore, the image processor 214 calculates arithmetic mean of the left opening pixel data l (Rl, Grl, Gbl, and Bl) and the right opening pixel data r (Rr, Grr, Gbr, and Br) to generate the display image data. That is, the left and right opening pixel data Grl, Grr, Gbl, and Gbr are read twice from the DRAM 226. In addition, the display image data at the position of the second pixel portion is obtained by performing interpolation calculation using the pixel data from the first pixel portion of the same color (B in the example of FIG. 5) around the second pixel portion.

In addition, in the tb reading, the control circuit 302 switches the setting of the pixel portion 303 so that all the opening signals (addition pixel signal of the light receiving portion l and the light receiving portion r) are output from the pixel portions 303 of a Gb row. Further, the pixel addition is set between the pixel portions 303.

Here, the same light is not necessarily incident on the light receiving portions t and b. In this case, there is possibility that the positional deviation occurs between the pixel signal of the base portion and the pixel signal of the reference portion. Therefore, in the second direction, a pair of pixel signals output from a plurality of adjacent light receiving portions t and light receiving portions b is set as one element (EL). The phase difference detection in the vertical direction in one focus detection region is performed by a plurality of elements. By processing in this way, the influence of positional deviation is reduced.

In the tb reading in the present embodiment, in order to increase the number of elements in the vertical direction, the pixel portion 303 is set so that the addition is not performed in the vertical direction which is the second direction. In addition, the pixel portion 303 is set so that the addition is not performed even in the horizontal direction which is the first direction. For example, the pixel portion 303 is set so that 1/1 pixel addition (that is, without addition) is performed on the pixel signals of the same openings (top openings or bottom openings) in both the horizontal direction and the vertical direction. On the other hand, in the tb reading in the present embodiment, it is possible to shorten the reading time by reading the pixel signals only from the Gb row.

Figures 10, 11:
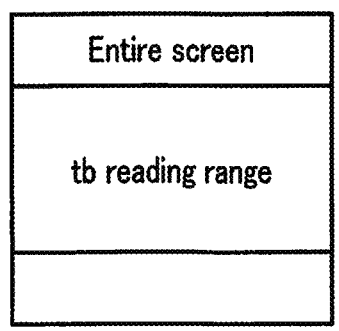
FIG. 10 is a diagram showing reading of the pixel signal of the base portion and the pixel signal of the reference portion in tb reading.
FIG. 11 is a diagram showing the limitation of the reading range in tb reading upon high-speed reading.

FIG. 10 is a diagram showing the reading of the pixel signal (top opening pixel signal) of the base portion and the pixel signal (bottom opening pixel signal) of the reference portion in the tb reading. At the time of the reading, the two top opening pixel signals included in ranges indicated by broken line frames EL11, EL21, EL31, EL41, and EL51, respectively, in FIG. 10 and the two bottom opening pixel signals included in ranges indicated by solid line frames EL12, EL22, EL32, EL42 and EL52, respectively, in FIG. 10 are read as one element EL.

The pixel signal read from the pixel portion 303 are subjected to analog processing in the analog processor 305. The pixel signal which is subjected to the analog processing is converted into the pixel data which is a digital signal in the ADC processor 306. The pixel data is stored in the memory circuit 307.

The horizontal scanning circuit 308 receives the control signal from the control circuit 302 and transfers the pixel data stored in the memory circuit 307 to an output circuit 309 in column order. The output circuit 309 arranges the pixel data transferred by the horizontal scanning circuit 308 to generate the pixel data string, and converts the generated pixel data string into a predetermined output signal type such as a serial signal and a differential signal and outputs the signal.

The pixel data string stored in the DRAM 226 by the tb reading is used for the correlation calculation for calculating the focus deviation amount. The focus detection circuit 218 performs the correlation calculation using the pair of top opening pixel data t and bottom opening pixel data b among the focus detection pixel data stored in the DRAM 226.

As described above, according to the present embodiment, the imaging element includes the first pixel portion having the light receiving portions which are pupil-split in the horizontal direction which is the first direction and the second pixel portion having the light receiving region and the non-light receiving region along the vertical direction which is the second direction. The first pixel portions are two-dimensionally arranged along the horizontal direction which is the first direction and the vertical direction which is the second direction. In addition, the second pixel portions are substituted for a part of the first pixel portions and arranged along the second direction. It is possible to perform the phase difference detection along the first direction by the light receiving portions constituting the first pixel portion. In addition, it is possible to perform the phase difference detection along the second direction by the second pixel portion. When the phase difference detection is performed along the second direction, only the pixel signals of the row including the second pixel portion may be read. For example, in the tb reading when the color filter array is the Bayer array, the pixel signals may be read only from the pixel portions of the Gb row. By doing so, the reading time for the tb reading is half the reading time in the case where the pixel signal is read from all the pixel portions as in the case of reading the still image pixel signal. Therefore, it is possible to shorten the reading time. In addition, since all the pixel portions do not include the second pixel portion, the degradation in image quality at the time of the display or the like is suppressed.

Modified Example

Hereinafter, a modified example of the present embodiment will be described. When a frame rate becomes faster than in the example of FIG. 5, it is necessary to read a pixel signal at a higher speed than in the above-described embodiment.

When high-speed reading is required, for example in tb reading, a reading range may be reduced as compared with a normal frame rate. For example, as shown in FIG. 11, by limiting the reading range to a 50% region including a central portion of a screen, a reading time is half the time of the tb reading over the entire screen. Limiting the reading range to 50% is to exclude upper 25% and lower 25% from the reading range. The reading range is not necessarily limited to the central portion of the screen. For example, if a subject can be specified by face detection, only a range including the subject may be set as the reading range.

Further, in rl and LV reading, it is preferable to increase the number of thinning out. For example, as shown in FIG. 12, in a vertical direction in the rl and LV reading, 1/9 pixel is added to read the pixel signal, such that the reading time is shortened as compared with the case of 1/5 pixel reading.

In addition, as in low luminance or the like, focus detection performance may be required more than the reading time. In the case where the focus detection performance is required, for example, the number of additions in the vertical direction may be increased in the rl and LV reading. For example, if the pixel addition in the rl and LV reading in the vertical direction is set to be 2/5 pixel addition, S/N becomes twice a normal time. As a result, the phase difference detection performance in the horizontal direction is improved.

In addition, live view resolution may be more required than the reading time or the focus detection performance. In this case, for example, in the rl and LV reading, the number of additions and the number of thinning out in the vertical direction may be reduced. For example, if the pixel addition in the rl and LV reading in the vertical direction is set to be 1/1 pixel addition, resolution becomes five times a normal time. As a result, the resolution of the live view is improved.

Further, in the above-described embodiment, it is assumed that a color filter is not arranged in a second pixel portion. This is because the pixel data itself at the position of the second pixel portion is not used for display or the like. On the other hand, by forming a B filter in the second pixel portion, the second pixel portion and the first pixel portion may be formed by the same process. In addition, by forming a G filter (Gb filter) in the second pixel portion, the amount of light that can be received as the imaging element may be increased.

Figure 13:
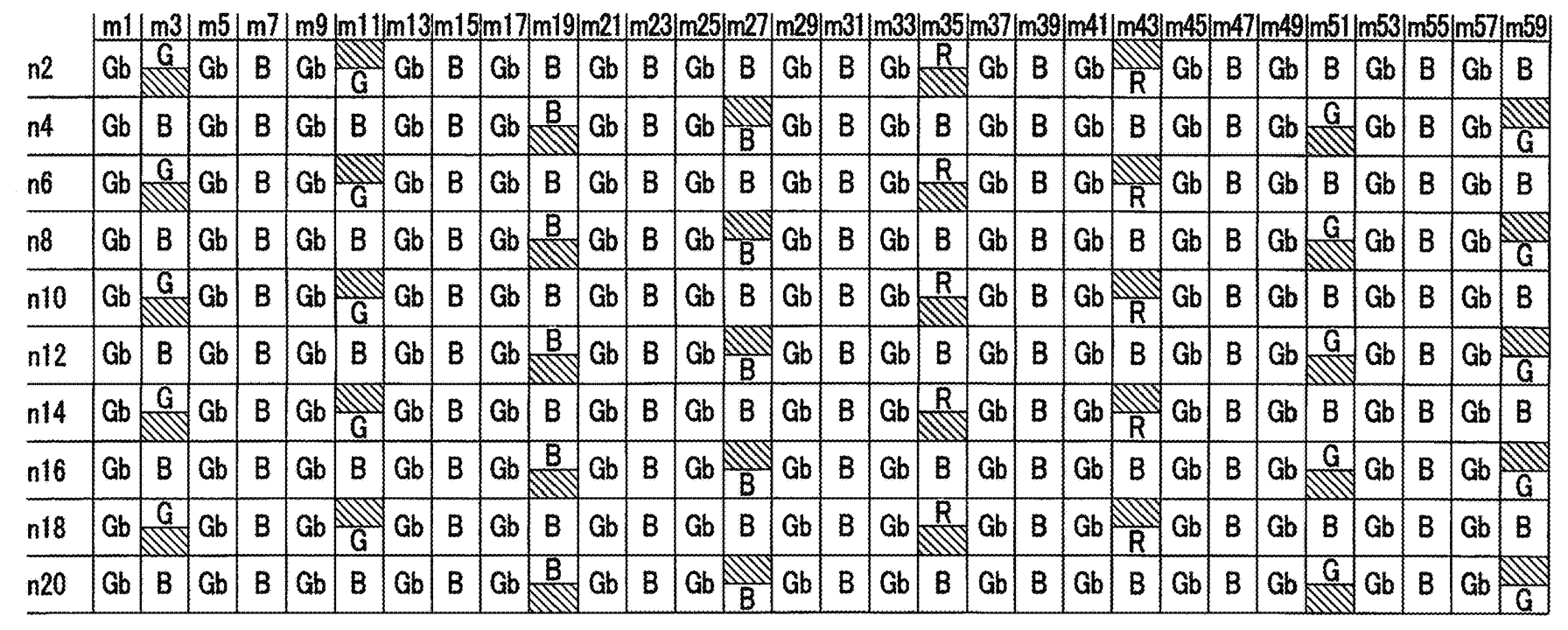

In addition, filters having a different color may be formed in the second pixel portion. In this case, it is necessary that filters having the same color are formed for the second pixel portion which is a pair. An example of such a filter array is shown in FIG. 13. In FIG. 13, the illustration of even-numbered columns is omitted. For the even-numbered columns, first pixel portions similar to that in FIG. 5 are arranged. In the example of FIG. 13, the G filters are formed for second pixel portions in 3rd and 11th columns, the B filters are formed for the second pixel portions in 19th and 27th columns, the R filters are formed for the second pixel portions in the 35th and 43rd columns, and the G filters are formed for the second pixel portions in 51st and 59th columns.

The second pixel portion is formed as shown in FIG. 13, and therefore can be used to display the pixel data from the second pixel portion, and the like. That is, the pixel data from the second pixel portion can be handled substantially equally to the pixel data from the first pixel portion by doubling the pixel data from the second pixel portion.

In addition, in the above-described embodiment, the second pixel portion is formed by shielding a light receiving region of a part of the light receiving portions with a light shielding portion. On the other hand, the second pixel portion can be formed without using the light shielding portion.

FIG. 14A is a diagram showing a first modified example of the second pixel portion. FIG. 14A shows an example in which only the light receiving portion corresponding to the second pixel portion among the light receiving portions having a longitudinally long rectangular shape is formed in a square shape. Similarly to the second pixel portion shown in FIG. 4B, the pixel portion including light receiving portions Bl and Br in FIG. 14A becomes a pixel portion which has a non-light receiving region on an upper side thereof and has a light receiving region on a lower side thereof.

FIG. 14B is a diagram showing a second modified example of the second pixel portion. FIG. 14B shows an example in which a circular microlens is formed in an elliptical shape. Similarly to the second pixel portion shown in FIG. 4B, the pixel portion including light receiving portions Bl and Br in FIG. 14B becomes a pixel portion which has a non-light receiving region on an upper side thereof and has a light receiving region on a lower side thereof.

In addition, in the embodiment described above, the first direction is defined as the horizontal direction, and the second direction is set as the vertical direction. Conversely, the first direction may be the vertical direction and the second direction may be the horizontal direction. In addition, in the above-described embodiment, one pixel includes two light receiving portions pupil-split in the first direction. On the other hand, one pixel may include four light receiving portions which are pupil-split in the first direction and the second direction.

In addition, in the above-described embodiment, the pixel addition and the like in the pixel portion 303 is set by the control circuit 302 provided inside the imaging element 208. The control circuit 302 may be provided outside the imaging element 208. In this case, for example, the CPU 212 may be configured to be able to perform the same processing as the control circuit 302.

In addition, each processing according to the above-described embodiment can also be stored as programs which can be executed by the CPU 212 or the control circuit 302 which is a computer. In addition, the programs can be stored in a storage medium of external storage devices such as a magnetic disk, an optical disk, a semiconductor memory, and distributed. The CPU 212 or the control circuit 302 can read the programs stored in the storage medium of the external storage device, and can execute the above-described processing by controlling the operation using the read program.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging element, comprising:
   a plurality of microlenses arranged in a first direction and a second direction;
   a plurality of first pixel portions each corresponding to one of the microlenses and including first light receiving portions being pupil-split in the first direction; and
   a plurality of second pixel portions each corresponding to one of the microlenses and including second light receiving portions being pupil-split in the first direction, the second light receiving portions including a light receiving region and a non-light receiving region along the second direction,
   wherein the first pixel portions are arranged in the first direction and the second direction, and the second pixel portions are substituted for some of the first pixel portions and are adjacently or discretely arranged in the second direction.

2. The imaging element according to claim 1, wherein the second pixel portions include a pair of a third pixel portion including the non-light receiving region on a first side in the second direction and a fourth pixel portion including the non-light receiving region on a second side in the second direction.

3. The imaging element according to claim 2, wherein the non-light receiving region is formed by shielding a part of light receiving regions of the third pixel portion and the fourth pixel portion.

4. The imaging element according to claim 2, wherein the third pixel portion and the fourth pixel portion are alternately arranged in the first direction.

5. The imaging element according to claim 2, wherein any one of the third pixel portion and the fourth pixel portion is arranged in the second direction.

6. The imaging element according to claim 1, comprising color filters Bayer-arrayed corresponding to each of the microlenses,
wherein the second pixel portions are arranged corresponding to a red or blue color filter of the color filters.

7. The imaging element according to claim 6, wherein the color filters are not arranged at a position of the second pixel portion.

8. The imaging element according to claim 6, wherein a green color filter of the color filters is arranged at a position of the second pixel portion.

9. The imaging element according to claim 1, wherein the second pixel portions are substituted for some of the first pixel portions and discretely arranged in the first direction.

10. The imaging element according to claim 1, wherein each of the second pixel portions includes the second light receiving portions which are pupil-split in the first direction.

11. The imaging element according to claim 10, wherein each of the second pixel portions is configured to add pixel signals of the second light receiving portions, and
the imaging element further comprises an addition circuit configured to add the pixel signals added in each of the second pixel portions.

12. The imaging element according to claim 11, wherein the addition circuit is configured to add the pixel signals of the second pixel portions in the first direction.

13. The imaging element according to claim 12, wherein the addition circuit is configured not to add the pixel signals of the second pixel portions in the second direction.

14. An imaging device, comprising:
the imaging element according to claim 1; and
a focus detection circuit that detects phase difference information based on pixel signals output from the first pixel portion and the second pixel portion of the imaging element,
wherein the focus detection circuit detects the phase difference information on the first direction based on the pixel signal from the first pixel portion and the phase difference information on the second direction based on the pixel signal from the second pixel portion.

15. The imaging device according to claim 14, further comprising a control circuit configured to control the imaging element to alternately output the pixel signal of the first pixel portion and the pixel signal of the second pixel portion.

16. The imaging device according to claim 15, wherein the control circuit outputs the pixel signals only from the first pixel portion and the second pixel portion which are arranged in the first direction in which the second pixel portion is positioned at a time of outputting the pixel signal of the second pixel portion.

* * * * *